US012577393B2

(12) United States Patent
Yoon et al.

(10) Patent No.: US 12,577,393 B2

(45) Date of Patent: Mar. 17, 2026

(54) POLYMER RESIN COMPOUND, METHOD FOR PRODUCING SAME, AND PHOTOSENSITIVE RESIN COMPOSITION COMPRISING SAME

(71) Applicant: LG CHEM, LTD., Seoul (KR)

(72) Inventors: Misun Yoon, Daejeon (KR); Sung Ho Chun, Daejeon (KR); Minyoung Lim, Daejeon (KR)

(73) Assignee: LG CHEM, LTD., Seoul (KR)

(*) Notice: Subject to any disclaimer, the term of this patent is extended or adjusted under 35 U.S.C. 154(b) by 817 days.

(21) Appl. No.: 17/773,141

(22) PCT Filed: Oct. 22, 2020

(86) PCT No.: PCT/KR2020/014509

§ 371 (c)(1),
(2) Date: Apr. 29, 2022

(87) PCT Pub. No.: WO2021/132865

PCT Pub. Date: Jul. 1, 2021

(65) Prior Publication Data

US 2023/0235169 A1 Jul. 27, 2023

(30) Foreign Application Priority Data

Dec. 23, 2019 (KR) ........................ 10-2019-0173199

(51) Int. Cl.

*C08L 67/04* (2006.01)
*C08G 59/24* (2006.01)

(Continued)

(52) U.S. Cl.

CPC ............ *C08L 67/04* (2013.01); *C08G 59/245* (2013.01); *C08G 59/688* (2013.01); *C08G 63/06* (2013.01); *G03F 7/038* (2013.01); *C08L 2203/16* (2013.01)

(58) Field of Classification Search

CPC ... C08L 67/04; C08L 2203/16; C08G 59/245; C08G 59/688; C08G 63/06; G03F 7/038

(Continued)

(56) References Cited

U.S. PATENT DOCUMENTS

2010/0029892 A1 2/2010 Heo et al.
2010/0085518 A1 4/2010 Choi et al.

(Continued)

FOREIGN PATENT DOCUMENTS

JP 2001-350009 A 12/2001
JP 2001-350260 A 12/2001

(Continued)

OTHER PUBLICATIONS

Ahn et al., KR 10-2015-006688 A machine translation in English, Jun. 17, 2015. (Year: 2015).*

(Continued)

*Primary Examiner* — David T Karst

(74) *Attorney, Agent, or Firm* — ROTHWELL, FIGG, ERNST & MANBACK, P.C.

(57) ABSTRACT

The present specification provides a polymer resin compound, a method for preparing the same, a photosensitive resin composition including the polymer resin compound, and a photosensitive material formed using the photosensitive resin composition.

7 Claims, 3 Drawing Sheets

(51) Int. Cl.
*C08G 59/68* (2006.01)
*C08G 63/06* (2006.01)
*G03F 7/038* (2006.01)

(58) Field of Classification Search
USPC .......................................................... 525/450
See application file for complete search history.

(56) References Cited

U.S. PATENT DOCUMENTS

| | | | |
|---|---|---|---|
| 2019/0161630 A1* | 5/2019 | Kim | C09D 11/037 |
| 2019/0241701 A1 | 8/2019 | Kim et al. | |
| 2020/0181322 A1 | 6/2020 | Lee et al. | |

FOREIGN PATENT DOCUMENTS

| | | | |
|---|---|---|---|
| JP | 2011-118368 | A | 6/2011 |
| JP | 2018-013716 | A | 1/2018 |
| KR | 10-2008-0077480 | A | 8/2008 |
| KR | 10-2008-0077815 | A | 8/2008 |
| KR | 10-2015-0066884 | A | 6/2015 |
| KR | 10-1740632 | B1 | 5/2017 |
| KR | 10-2018-0101045 | A | 9/2018 |
| KR | 10-2019-0017265 | A | 2/2019 |
| WO | 2019-194402 | A1 | 10/2019 |

OTHER PUBLICATIONS

Ahn et al., KR 10-2015-0066884 A machine translation in English, Jun. 17, 2015. (Year: 2015).*

International Search Report and Written Opinion issued for International Application No. PCT/KR2020/014509 on Feb. 23, 2021, 10 pages.

* cited by examiner

【FIG. 1】
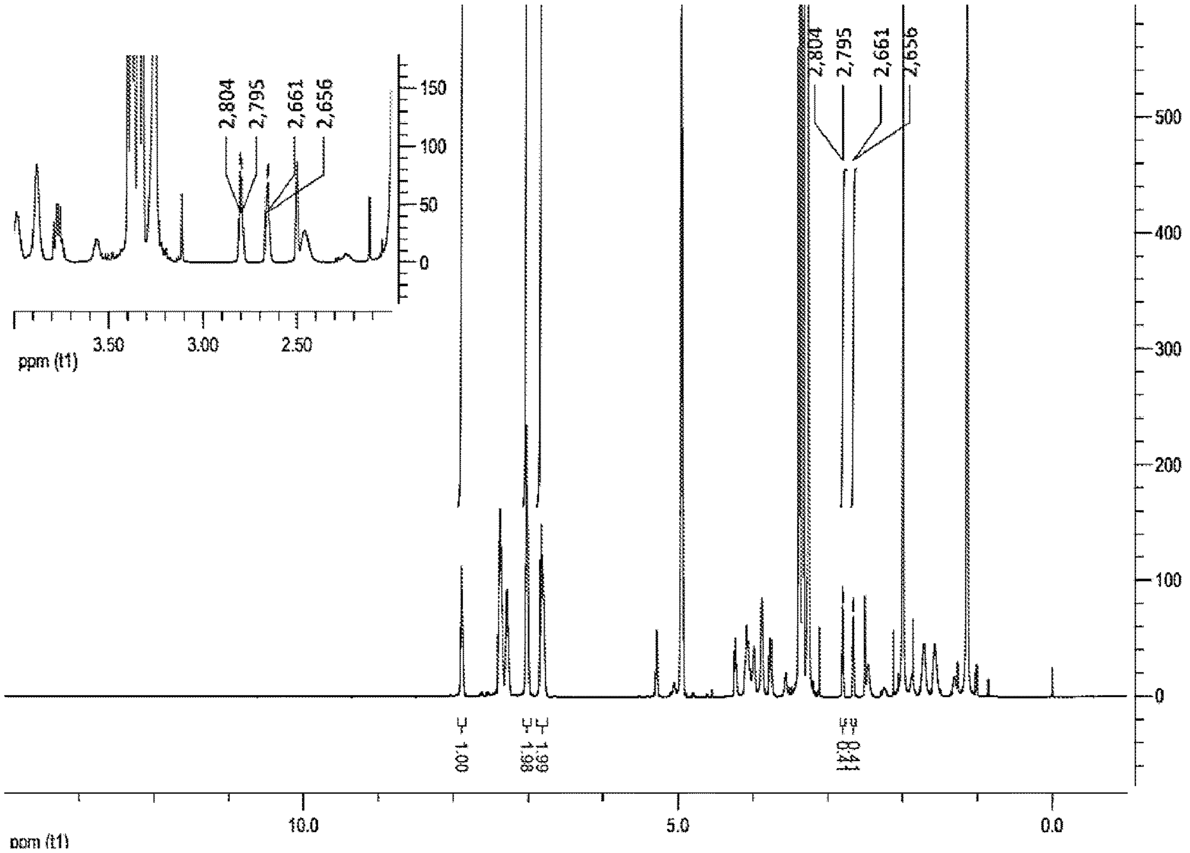

【FIG. 2】
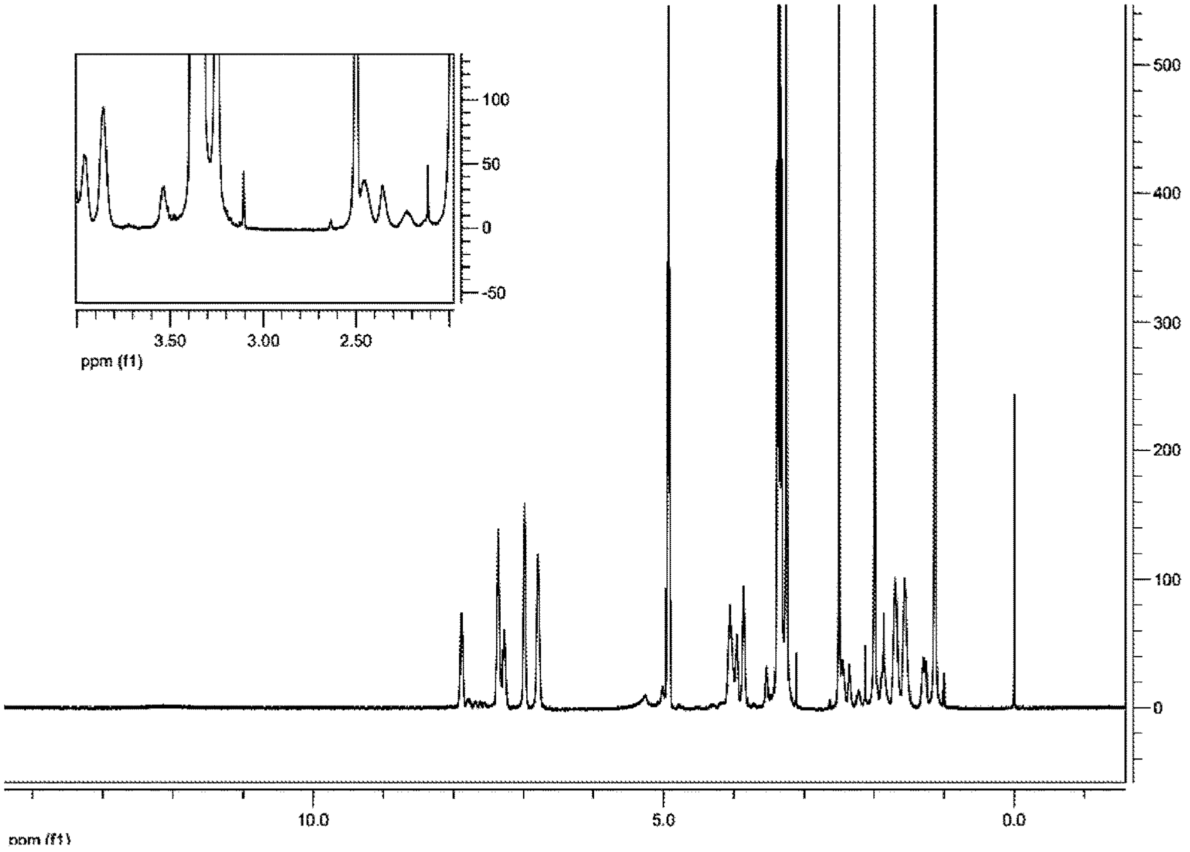

【FIG. 3】
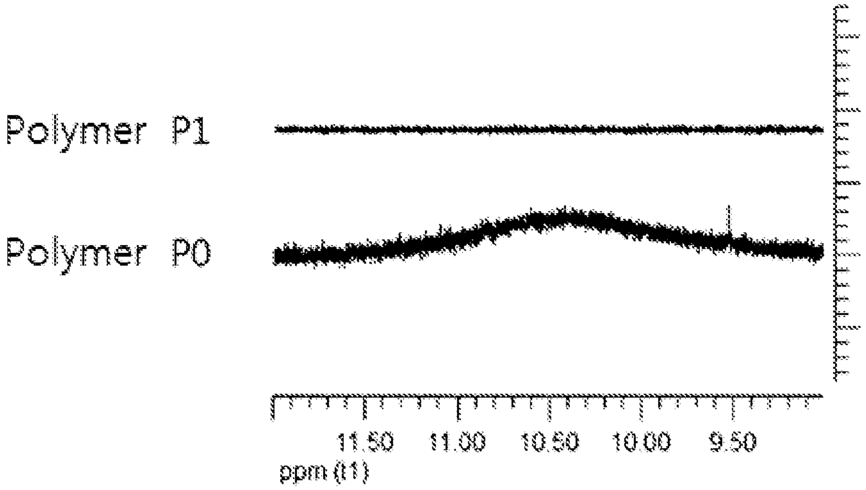

POLYMER RESIN COMPOUND, METHOD FOR PRODUCING SAME, AND PHOTOSENSITIVE RESIN COMPOSITION COMPRISING SAME

This application is a 35 U.S.C. 371 National Phase Entry Application from PCT/KR2020/014509, filed on Oct. 22, 2020, which claims priority to and the benefits of Korean Patent Application No. 10-2019-0173199, filed with the Korean Intellectual Property Office on Dec. 23, 2019, the entire contents of which are incorporated herein by reference.

TECHNICAL FIELD

The present specification relates to a polymer resin compound, a method for preparing the same, a photosensitive resin composition including the polymer resin compound, and a photosensitive material formed using the photosensitive resin composition.

BACKGROUND OF THE INVENTION

A bank in an organic light emitting device (OLED) performs a role of forming a polyimide insulating layer in all regions other than a region in which an organic light emitting material is deposited and to function as a pixel, and thereby defining a shape of the pixel, and enables electrically independent driving for each of the pixels.

A generally used polyimide-based transparent bank has a limit in preventing reflection of external light incident through a display. In addition, defects in terms of image quality such as a light leakage occurrence may occur due to a reflection by an electrode formed with metal materials. In addition, when using a polarizing plate on a top of OLED to resolve such a problem, transmittance significantly decreases, which requires high voltage driving in order to obtain higher transmittance leading to another problem of reducing a lifetime of an organic light emitting device.

A black bank developed in view of the above may have light-shielding properties that have not been found in an existing polyimide-based transparent bank insulating layer, and may reduce a reflection by absorbing incident external light. As a result, a polarizing plate that has been additionally used for the external light reflection is not required, and problems caused by polarizing plate introduction may be resolved.

Accordingly, studies for enhancing performance of a black bank have been required in the art.

BRIEF SUMMARY OF THE INVENTION

The present specification provides a method for preparing a polymer resin compound, a polymer resin compound prepared using the preparation method, a photosensitive resin composition including the polymer resin compound, and a photosensitive material formed using the photosensitive resin composition.

One embodiment of the present specification provides a method for preparing a polymer resin compound, the method including mixing a polymerization composition including a first compound represented by the following Chemical Formula 1; and a second compound represented by the following Chemical Formula 2, wherein a content of the first compound is greater than 100 mol % based on 100 mol % of the second compound.

[Chemical Formula 1]

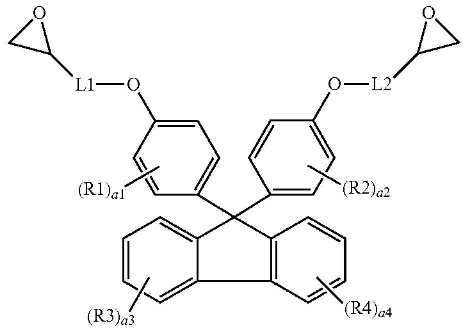

[Chemical Formula 2]

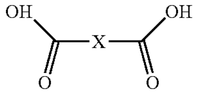

In Chemical Formulae 1 and 2,

R1 to R4 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, X is a substituted or unsubstituted alkylene group; a substituted or unsubstituted cycloalkylene group; or a substituted or unsubstituted arylene group, L1 and L2 are the same as or different from each other, and each independently a direct bond; or a substituted or unsubstituted alkylene group, a1 to a4 are the same as or different from each other, and each independently an integer of 0 to 4, and when a1 to a4 are 2 or greater, substituents in the parentheses are the same as or different from each other.

Another embodiment of the present specification provides a polymer resin compound including a first unit derived from the first compound represented by Chemical Formula 1; and a second unit derived from the second compound represented by Chemical Formula 2, wherein a content of the first compound is greater than 100 mol % based on 100 mol % of the second compound.

Another embodiment of the present specification provides a photosensitive resin composition including the polymer resin compound, a multifunctional monomer, a photoinitiator, a colorant and a solvent.

Another embodiment of the present specification provides a photosensitive material formed using the photosensitive resin composition.

Advantageous Effects

A polymer resin compound according to one embodiment of the present specification has advantages of allowing thermal crosslinking, having superior compatibility and solubility, and having the structure readily modified.

BRIEF DESCRIPTION OF DRAWINGS

FIG. 1 shows an NMR analysis result on Polymer P1 synthesized in Synthesis Example 1 of the present application.

FIG. 2 shows an NMR analysis result on Polymer P0 synthesized in Comparative Synthesis Example 1 of the present application.

FIG. 3 is an enlarged view of a peak near 10.5 ppm in the NMR graphs of Polymer P1 and Polymer P0.

DETAILED DESCRIPTION OF THE INVENTION

Hereinafter, the present disclosure will be described in more detail.

One embodiment of the present specification provides a method for preparing a polymer resin compound, the method including mixing a polymerization composition including a first compound represented by the following Chemical Formula 1; and a second compound represented by the following Chemical Formula 2, wherein a content of the first compound is greater than 100 mol % based on 100 mol % of the second compound.

[Chemical Formula 1]

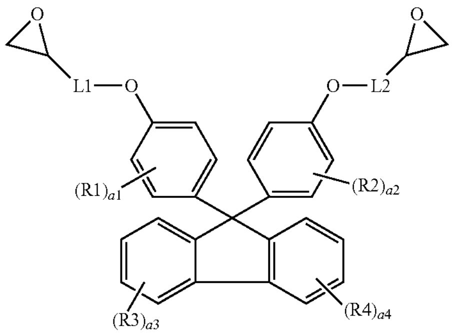

[Chemical Formula 2]

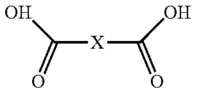

In Chemical Formulae 1 and 2,

R1 to R4 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, X is a substituted or unsubstituted alkylene group; a substituted or unsubstituted cycloalkylene group; or a substituted or unsubstituted arylene group, L1 and L2 are the same as or different from each other, and each independently a direct bond; or a substituted or unsubstituted alkylene group, a1 to a4 are the same as or different from each other, and each independently an integer of 0 to 4, and when a1 to a4 are 2 or greater, substituents in the parentheses are the same as or different from each other.

When preparing a polymer resin compound using the preparation method according to one embodiment of the present specification, a polyester-based polymer having an epoxide group at the end may be prepared, and there are advantages of being crosslinked by heat, and having superior compatibility with a pigment used in a photosensitive resin composition. In addition, the basic structure is readily modified by an alcohol group and the epoxide group at the end, which are functional groups, and therefore, properties such as developability and crosslinking density may be controlled. In addition thereto, the compound has excellent solubility for solvents used in the photosensitive resin composition, and therefore, there is an advantage of using a desired solvent freely, and it is effective in reducing the amount of an out-gas generated in a post process when using as a photoresist for an OLED.

In the present specification, a description of a certain member being placed "on" another member includes not only a case of the one member being in contact with the another member but a case of still another member being present between the two members.

In the present specification, a certain part "including" certain constituents means capable of further including other constituents, and does not exclude other constituents unless particularly stated on the contrary.

In the present specification, a "unit derived from a compound" or a "structure derived from a compound" means, when polymerizing the corresponding compound using a common polymerization method in the art, a unit or a structure formed by the corresponding compound in the synthesized polymer.

In the present specification, examples of substituents are described below, however, the substituents are not limited thereto.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term "substituted or unsubstituted" means being substituted with one, two or more substituents selected from the group consisting of deuterium; a halogen group; a hydroxyl group; a carboxyl group; an alkyl group; a cycloalkyl group; an alkylene group; an alkenyl group; an alkynyl group; an alkoxy group; an alkylthio group; a silyl group; a phosphine oxide group; an amine group; an aryl group; and a heterocyclic group, or having no substituents.

In the present specification, the halogen group is fluorine, chlorine, bromine or iodine.

In the present specification, the alkyl group may be linear or branched, and although not particularly limited thereto, the number of carbon atoms of the alkyl group may be from 1 to 30. Examples of the alkyl group may include a methyl group, an ethyl group, an n-propyl group, an isopropyl group, an n-butyl group, an isobutyl group, a tert-butyl group, an n-pentyl group, an n-hexyl group, an n-heptyl group, an n-octyl group and the like, but are not limited thereto.

In the present specification, the alkylene group means alkane having two bonding sites, that is, a divalent group. The descriptions on the alkyl group provided above may be applied thereto except for those that are each a divalent group.

In the present specification, the number of the cycloalkyl group is not particularly limited, but is preferably from, for example, 3 to 30. Examples of the cycloalkyl group may include a cyclopropyl group, a cyclobutyl group, a cyclopentyl group, a cyclohexyl group, a cycloheptyl group, a cyclooctyl group and the like, but are not limited thereto.

In the present specification, the cycloalkylene group means cycloalkane having two bonding sites, that is, a divalent group. The descriptions on the cycloalkyl group provided above may be applied thereto except for those that are each a divalent group.

In the present specification, the alkenyl group may be linear or branched, and although not particularly limited thereto, the number of carbon atoms is preferably from 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the alkynyl group may be linear or branched, and although not particularly limited thereto, the number of carbon atoms is preferably from 2 to 30. Specific examples thereof may include alkynyl groups such as ethynyl, propynyl, 2-methyl-2-propynyl, 2-butynyl and 2-pentynyl, but are not limited thereto.

In the present specification, the alkoxy group may be linear, branched or cyclic. The number of carbon atoms of the alkoxy group is not particularly limited, but is preferably from 1 to 30. Examples of the alkoxy group may include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy and the like, but are not limited thereto.

In the present specification, the alkylthio group may be linear, branched or cyclic. The number of carbon atoms of the alkylthio group is not particularly limited, but is preferably from 1 to 20. Specific examples thereof may include methylthio, ethylthio, n-propylthio, isopropylthio, i-propylthio, n-butylthio, isobutylthio, tert-butylthio, sec-butylthio, n-pentylthio, neopentylthio, isopentylthio, n-hexylthio, 3,3-dimethylbutylthio, 2-ethylbutylthio, n-octylthio, n-nonylthio, n-decylthio, benzylthio, p-methylbenzylthio and the like, but are not limited thereto.

In the present specification, the number of carbon atoms of the aryl group is not particularly limited, but is preferably from 6 to 30. Examples of the aryl group may include a phenyl group, a biphenyl group, a terphenyl group, a naphthyl group, an anthracenyl group, an indenyl group, a phenanthrenyl group, a pyrenyl group, a perylenyl group, a triphenyl group, a chrysenyl group, a fluorenyl group and the like, but are not limited thereto.

In the present specification, the arylene group means aromatic hydrocarbon having two bonding sites, that is a divalent group. The descriptions on the aryl group provided above may be applied thereto except for those that are each a divalent group.

In the present specification, the heterocyclic group is a group including one or more atoms that are not carbon, that is, heteroatoms, and specifically, the heteroatom may include one or more atoms selected from the group consisting of O, N, Se, S and the like. Although not particularly limited thereto, the number of carbon atoms is preferably from 2 to 30. Examples of the heterocyclic group may include a thiophene group, a furan group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, an isoxazole group, a thiadiazole group, a phenothiazine group, a dibenzofuran group and the like, but are not limited thereto.

In the present specification, the silyl group is a substituent including Si, having the Si atom directly linked as a radical, and is represented by $—SiR_{104}R_{105}R_{106}$. $R_{104}$ to $R_{106}$ are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, specific examples of the phosphine oxide group may include a diphenylphosphine oxide group, a dinaphthylphosphine oxide group and the like, but are not limited thereto.

In the present specification, the number of carbon atoms of the amine group is not particularly limited, but is preferably from 1 to 30. The amine group may be substituted with the alkyl group, the aryl group, the heterocyclic group, the alkenyl group, the cycloalkyl group described above or a combination thereof, and specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

In the present specification, a thiol group means a substituent represented by —SH.

In the present specification, an epoxide group means a substituent represented by

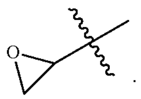 [SMILES: *C1CO1]

In the present specification, an acrylate group means a substituent represented by

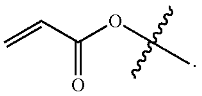 [SMILES: *OC(=O)C=C]

In the present specification, a ring means a substituted or unsubstituted hydrocarbon ring; or a substituted or unsubstituted heteroring.

In one embodiment of the present specification, a content of the first compound is greater than 100 mol % and less than or equal to 200 mol %, preferably from 130 mol % to 200 mol %, and more preferably from 150 mol % to 200 mol % based on 100 mol % of the second compound. When the content of the first compound is higher than the content of the second compound, a compound having an epoxide as an end group may be synthesized, and from this, target properties may be obtained by allowing thermal crosslinking and readily modifying the structure. However, the content being greater than 200 mol % has a disadvantage of being polymerized in an oligomer form by failing to become a polymer.

In one embodiment of the present specification, the polymerization composition further includes a third compound represented by the following Chemical Formula 3. In this case, the epoxide end group formed through the reaction of the first compound and the second compound reacts again with the third compound, and therefore the end group of the polymer resin compound may change to a structure of the following Chemical Formula 3.

[Chemical Formula 3]

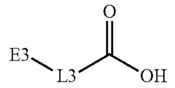

In Chemical Formula 3,

L3 is a direct bond; a substituted or unsubstituted alkylene group; or a substituted or unsubstituted arylene group, and E3 is hydrogen; a hydroxyl group; a thiol group; a substituted or unsubstituted alkyl group; a substituted or unsubstituted alkenyl group; a substituted or unsubstituted alkynyl group; a substituted or unsubstituted cycloalkyl group; a substituted or unsubstituted alkoxy group; a substituted or unsubstituted alkylthio group; a substituted or unsubstituted aryl group; or an epoxide group.

In one embodiment of the present specification, a content of the third compound is from 1 mol % to 200 mol %, preferably from 10 mol % to 200 mol %, and more preferably from 50 mol % to 200 mol % based on a content difference of 100 mol % between the first compound and the second compound.

In one embodiment of the present specification, the polymerization composition further includes one or more fourth compounds selected from among a compound represented by the following Chemical Formula 4-1 and a compound represented by the following Chemical Formula 4-2. In this case, the —OH functional group formed through the reaction of the first compound and the second compound reacts again with the fourth compound, and therefore the side chain structure of the polymer resin compound may change.

[Chemical Formula 4-1]

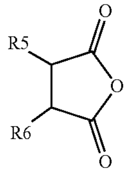

[Chemical Formula 4-2]

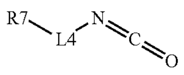

In Chemical Formulae 4-1 and 4-2,

R5 to R7 are the same as or different from each other, and each independently hydrogen; deuterium; a halogen group; a substituted or unsubstituted acrylate group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, R5 and R6 optionally bond to each other to form a ring, and L4 is a direct bond; a substituted or unsubstituted alkylene group; or a substituted or unsubstituted arylene group.

In one embodiment of the present specification, a content of the fourth compound is from 1 mol % to 200 mol %, preferably from 10 mol % to 200 mol %, and more preferably from 50 mol % to 200 mol % based on a content difference of 100 mol % between the first compound and the second compound.

In one embodiment of the present specification, the polymerization composition further includes a base catalyst and a solvent.

In one embodiment of the present specification, the base catalyst is one or more types selected from among phosphine-based catalysts such as tributylphosphine, methyldiphenylphosphine, triphenylphosphine, diphenylphosphine and phenylphosphine; amine-based catalysts such as 1,4-diaza bicyclo[2,2,2]octa ne, 1,8-diazabicyclo[5,4,0]-undecane, 1,5-diaza bicyclo[4,3,0]non-5-ene, 2,6-dimethylpiperidine, triethylamine, tripropylamine, tributylamine, trioctylamine, diisopropylethylamine, N,N-dimethylaniline, N,N-diethylaniline, N,N,N,N'-tetramethylethylenediamine and N,N-dimethylbenzylamine; and pyridine-based catalysts such as pyridine and 4-(N,N-dimethylamino)pyridine, and is preferably triphenylphosphine.

In one embodiment of the present specification, a content of the base catalyst is from 0.2 wt % to 10 wt %, and preferably from 0.5 wt % to 5 wt % based on 100 wt % of the polymerization composition. When the base catalyst is included in the content of the above-mentioned range, a copolymer with a proper molecular weight may be obtained, and it is effective in preventing an excessively added residual initiator from being detected as an out-gas component.

In one embodiment of the present specification, the solvent of the polymerization composition may be one or more types selected from among the following structures, and is preferably from 1-methoxypropan-2-yl acetate (PGMEA).

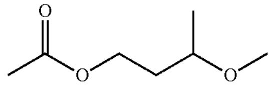

3-methoxybutyl acetate
Molecular Weight: 146.18
3-MBA 175

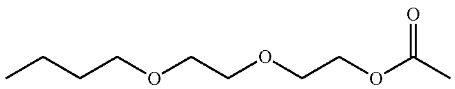

2-(2-butoxyethoxy)ethyl acetate
Molecular Weight: 204.26
BCA 245

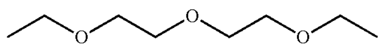

1-ethoxy-2-(2-ethoxyethoxy)ethane
Molecular Weight: 162.23
DEDG 180

-continued

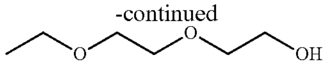

2-(2-ethoxyethoxy)ethanol
Molecular Weight: 134.17
DGME 202

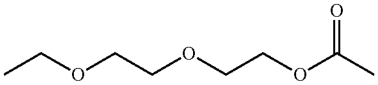

2-(2-ethoxyethoxy)ethyl acetate
Molecular Weight: 176.21
ECA 218

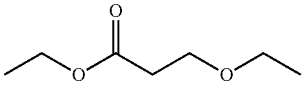

ethyl 3-ethoxypropanoate
Molecular Weight: 146.18
EEP 166

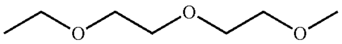

1-ethoxy-2-(2-methoxyethoxy)ethane
Molecular Weight: 148.20
MEDG 179

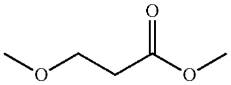

methyl 3-methoxypropanoate
Molecular Weight: 118.13
MMP 143

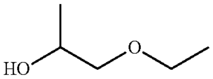

1-ethoxypropan-2-ol
Molecular Weight: 104.15
PGEE 131

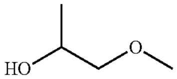

1-methoxypropan-2-ol
Molecular Weight: 90.12
PGME 119

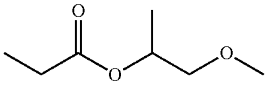

1-methoxypropan-2-yl propionate
Molecular Weight: 146.18
PGMEP 178

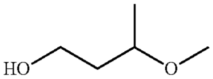

3-methoxybutan-1-ol
Molecular Weight: 104.15
3-MB 160

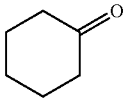

cyclohexanone
Molecular Weight: 98.14
CHN 155

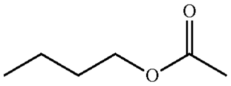

butyl acetate
Molecular Weight: 116.16
n-BA 124

-continued

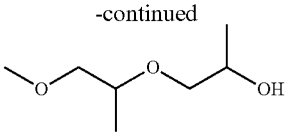

1-((1-methoxypropan-2-yl)oxy)propan-2-ol
Molecular Weight: 148.20
DPM 188

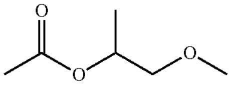

1-methoxypropan-2-yl acetate
Molecular Weight: 132.16
PGMEA 145

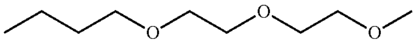

1-(2-(2-methoxyethoxy)ethoxy)butane
Molecular Weight: 176.25
MBDG 211

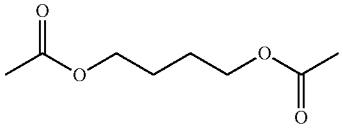

butane-1,4-diyl diacetate
Molecular Weight: 174.19
1,4-BDDA (BGDA) 229

In one embodiment of the present specification, the rest other than the first to the fourth compounds, and the base catalyst in the polymerization composition may all be the solvent.

In one embodiment of the present specification, the method for preparing a polymer resin compound further includes heating the polymerization composition to a temperature of 60° C. to 150° C., and preferably 90° C. to 120° C. When the heating temperature is lower than 60° C., the conversion rate of the monomer to the polymer is low, and when the heating temperature is higher than 150° C., the polymer resin compound may have reduced stability.

In one embodiment of the present specification, the polymer resin compound is prepared using the method for preparing a polymer resin compound described above.

In one embodiment of the present specification, the polymer resin compound includes a first unit derived from the first compound represented by Chemical Formula 1; and a second unit derived from the second compound represented by Chemical Formula 2, wherein a content of the first compound is greater than 100 mol % based on 100 mol % of the second compound.

In one embodiment of the present specification, the polymer resin compound further includes a structure derived from the third compound represented by Chemical Formula 3.

In one embodiment of the present specification, the polymer resin compound further includes a structure derived from one or more fourth compounds selected from among the compound represented by Chemical Formula 4-1 and the compound represented by Chemical Formula 4-2.

In one embodiment of the present specification, each of the constitutions of the polymer resin compound may cite the descriptions on each of the constitutions of the method for preparing a polymer resin compound described above.

In one embodiment of the present specification, the polymer resin compound is represented by the following Chemical Formula 5.

[Chemical Formula 5]

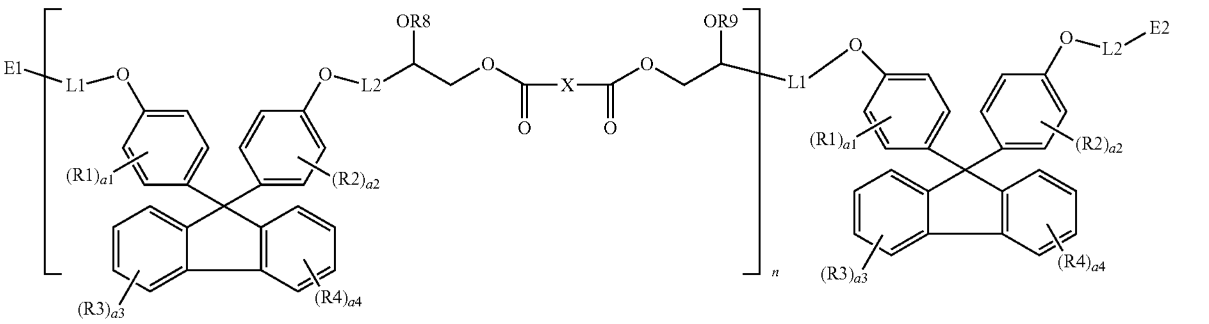

In Chemical Formula 5,

E1 and E2 are the same as or different from each other, and each independently an epoxide group; or a group represented by the following Chemical Formula 6, R8 and R9 are the same as or different from each other, and each independently hydrogen; or a group represented by the following Chemical Formula 7-1 or 7-2, R1 to R4 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, X is a substituted or unsubstituted alkylene group; a substituted or unsubstituted cycloalkylene group; or a substituted or unsubstituted arylene group, L1 and L2 are the same as or different from each other, and each independently a direct bond; or a substituted or unsubstituted alkylene group, a1 to a4 are the same as or different from each other, and each independently an integer of 0 to 4, when a1 to a4 are 2 or greater, substituents in the parentheses are the same as or different from each other, and n is, as a repetition number, an integer of 1 to 40,

[Chemical Formula 6]

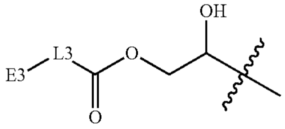

[Chemical Formula 7-1]

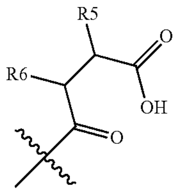

-continued

[Chemical Formula 7-2]

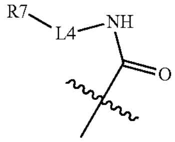

in Chemical Formulae 6, 7-1 and 7-2,

L3 and L4 are the same as or different from each other, and each independently a direct bond; a substituted or unsubstituted alkylene group; or a substituted or unsubstituted arylene group, E3 is hydrogen; a hydroxyl group; a thiol group; a substituted or unsubstituted alkyl group; a substituted or unsubstituted alkenyl group; a substituted or unsubstituted alkynyl group; a substituted or unsubstituted cycloalkyl group; a substituted or unsubstituted alkoxy group; a substituted or unsubstituted alkylthio group; a substituted or unsubstituted aryl group; or an epoxide group, R5 to R7 are the same as or different from each other, and each independently hydrogen; deuterium; a halogen group; a substituted or unsubstituted acrylate group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, R5 and R6 optionally bond to each other to form a ring, and

means a site linked to Chemical Formula 5.

In one embodiment of the present specification, E1 and E2 are each an epoxide group.

In one embodiment of the present specification, Chemical Formula 5 is represented by the following Chemical Formula 5-1 or 5-2.

[Chemical Formula 5-1]

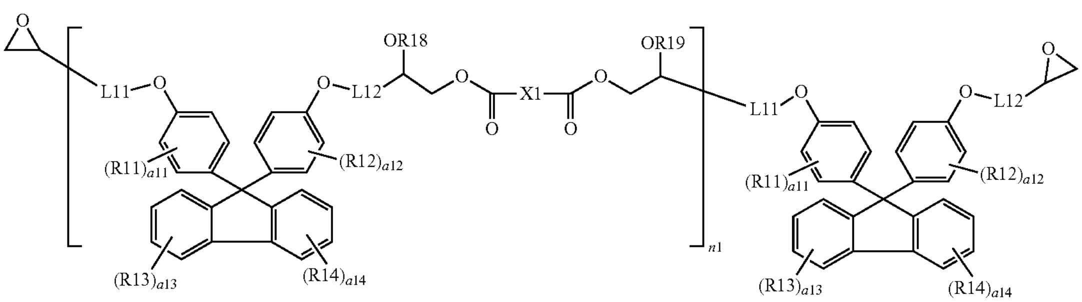

[Chemical Formula 5-2]

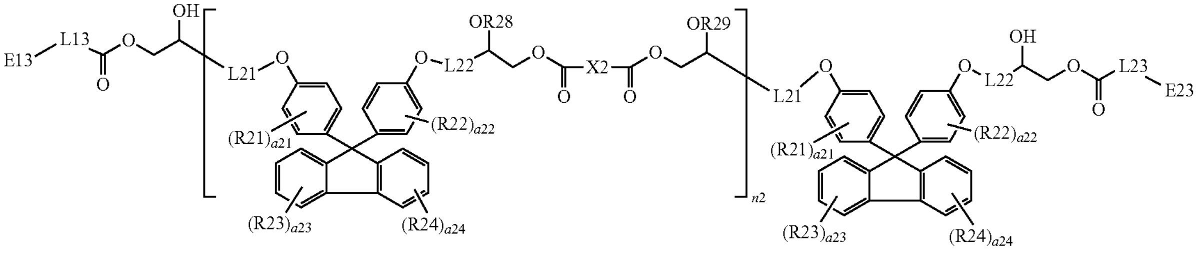

In Chemical Formulae 5-1 and 5-2,

R18, R19, R28 and R29 are the same as or different from each other, and each independently hydrogen; or the group represented by Chemical Formula 7-1 or 7-2, R11 to R14 and R21 to R24 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, X1 and X2 are the same as or different from each other, and each independently a substituted or unsubstituted alkylene group; a substituted or unsubstituted cycloalkylene group; or a substituted or unsubstituted arylene group, L11, L12, L21 and L22 are the same as or different from each other, and each independently a direct bond; or a substituted or unsubstituted alkylene group, a11 to a14 and a21 to a24 are the same as or different from each other, and each independently an integer of 0 to 4, when a11 to a14 and a21 to a24 are 2 or greater, substituents in the parentheses are the same as or different from each other, n1 and n2 are, as a repetition number, the same as or different from each other, and each independently an integer of 1 to 40, E13 and E23 are the same as or different from each other, and each independently hydrogen; a hydroxyl group; a thiol group; a substituted or unsubstituted alkyl group; a substituted or unsubstituted alkenyl group; a substituted or unsubstituted alkynyl group; a substituted or unsubstituted cycloalkyl group; a substituted or unsubstituted alkoxy group; a substituted or unsubstituted alkylthio group; a substituted or unsubstituted aryl group; or an epoxide group, and L13 and L23 are a direct bond; a substituted or unsubstituted alkylene group; or a substituted or unsubstituted arylene group.

In one embodiment of the present specification, R1 to R4 are each hydrogen.

In one embodiment of the present specification, R11 to R14 are each hydrogen.

In one embodiment of the present specification, R21 to R24 are each hydrogen.

In one embodiment of the present specification, L1 and L2 are each an alkylene group having 1 to 10 carbon atoms.

In one embodiment of the present specification, L1 and L2 are each a linear alkylene group having 1 to 10 carbon atoms.

In one embodiment of the present specification, L1 and L2 are each a linear alkylene group having 1 to 5 carbon atoms.

In one embodiment of the present specification, L1 and L2 are each a linear alkylene group having 1 to 3 carbon atoms.

In one embodiment of the present specification, L1 and L2 are each a methylene group.

In one embodiment of the present specification, L11 and L12 are each an alkylene group having 1 to 10 carbon atoms.

In one embodiment of the present specification, L11 and L12 are each a linear alkylene group having 1 to 10 carbon atoms.

In one embodiment of the present specification, L11 and L12 are each a linear alkylene group having 1 to 5 carbon atoms.

In one embodiment of the present specification, L11 and L12 are each a linear alkylene group having 1 to 3 carbon atoms.

In one embodiment of the present specification, L11 and L12 are each a methylene group.

In one embodiment of the present specification, L21 and L22 are each an alkylene group having 1 to 10 carbon atoms.

In one embodiment of the present specification, L21 and L22 are each a linear alkylene group having 1 to 10 carbon atoms.

In one embodiment of the present specification, L21 and L22 are each a linear alkylene group having 1 to 5 carbon atoms.

In one embodiment of the present specification, L21 and L22 are each a linear alkylene group having 1 to 3 carbon atoms.

In one embodiment of the present specification, L21 and L22 are each a methylene group.

In one embodiment of the present specification, X is a cycloalkylene group having 3 to 10 carbon atoms.

In one embodiment of the present specification, X is a cycloalkylene group having 4 to 8 carbon atoms.

In one embodiment of the present specification, X is a cyclohexylene group.

In one embodiment of the present specification, X1 is a cycloalkylene group having 3 to 10 carbon atoms.

In one embodiment of the present specification, X1 is a cycloalkylene group having 4 to 8 carbon atoms.

In one embodiment of the present specification, X1 is a cyclohexylene group.

In one embodiment of the present specification, X2 is a cycloalkylene group having 3 to 10 carbon atoms.

In one embodiment of the present specification, X2 is a cycloalkylene group having 4 to 8 carbon atoms.

In one embodiment of the present specification, X2 is a cyclohexylene group.

In one embodiment of the present specification, L3 is a substituted or unsubstituted arylene group having 6 to 10 carbon atoms.

In one embodiment of the present specification, L3 is a substituted or unsubstituted monocyclic arylene group.

In one embodiment of the present specification, L3 is a substituted or unsubstituted phenylene group.

In one embodiment of the present specification, L3 is a phenylene group.

In one embodiment of the present specification, L13 and L23 are each a substituted or unsubstituted arylene group having 6 to 10 carbon atoms.

In one embodiment of the present specification, L13 and L23 are each a substituted or unsubstituted monocyclic arylene group.

In one embodiment of the present specification, L13 and L23 are each a substituted or unsubstituted phenylene group.

In one embodiment of the present specification, L13 and L23 are each a phenylene group.

In one embodiment of the present specification, E3 is a hydroxyl group.

In one embodiment of the present specification, E13 and E23 are each a hydroxyl group.

In one embodiment of the present specification, R5 and R6 bond to each other to form a substituted or unsubstituted aromatic hydrocarbon ring.

In one embodiment of the present specification, R5 and R6 bond to each other to form a substituted or unsubstituted benzene ring.

In one embodiment of the present specification, R5 and R6 bond to each other to form a benzene ring unsubstituted or substituted with a carboxyl group.

In one embodiment of the present specification, R5 and R6 bond to each other to form a benzene ring substituted with a carboxyl group.

In one embodiment of the present specification, L4 is an alkylene group having 1 to 10 carbon atoms.

In one embodiment of the present specification, L4 is a linear alkylene group having 1 to 10 carbon atoms.

In one embodiment of the present specification, L4 is a linear alkylene group having 1 to 5 carbon atoms.

In one embodiment of the present specification, L4 is a linear alkylene group having 1 to 3 carbon atoms.

In one embodiment of the present specification, L4 is an ethylene group.

In one embodiment of the present specification, R7 is an acrylate group.

In one embodiment of the present specification, n is an integer of 2 to 40, and specifically an integer of 5 to 40.

In one embodiment of the present specification, n1 and n2 are each an integer of 2 to 40, and specifically an integer of 5 to 40.

In one embodiment of the present specification, Chemical Formula 4-1 is represented by the following Chemical Formula 4-1-1.

[Chemical Formula 4-1-1]

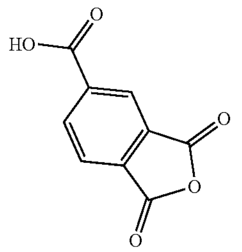

In one embodiment of the present specification, Chemical Formula 4-2 is represented by the following Chemical Formula 4-2-1.

[Chemical Formula 4-2-1]

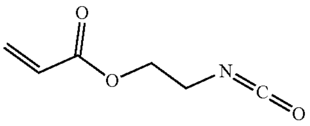

In one embodiment of the present specification, R8 and R9 are each hydrogen; a group represented by the following Chemical Formula 7-1-1; or a group represented by the following Chemical Formula 7-2-1.

[Chemical Formula 7-1-1]

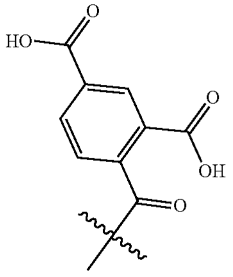

[Chemical Formula 7-2-1]

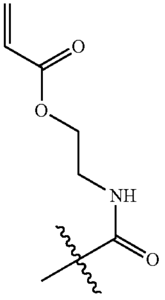

In one embodiment of the present specification, R18 and R19 are each hydrogen; the group represented by Chemical Formula 7-1-1; or the group represented by Chemical Formula 7-2-1.

In one embodiment of the present specification, R28 and R29 are each hydrogen; the group represented by Chemical Formula 7-1-1; or the group represented by Chemical Formula 7-2-1.

In one embodiment of the present specification, the polymer resin compound may include an epoxide peak between 2.6 ppm to 2.9 ppm based on a 1H-NMR analysis result. Specifically, two epoxide peaks may be included between 2.65 ppm to 2.85 ppm.

In the present specification, the 1H-NMR analysis is conducted at room temperature using an NMR spectrometer including a Varian Unity Inova (500 MHz) spectrometer having a triple resonance 5 mm probe. The material subject to the analysis is diluted to a concentration of approximately 10 mg/ml in a solvent (Acetone_d6) for NMR measurement, and used.

In one embodiment of the present specification, the polymer resin compound has a weight average molecular weight of 2,000 g/mol to 20,000 g/mol, and preferably 2,000 g/mol to 10,000 g/mol.

The molecular weight of less than 2,000 g/mol has a disadvantage in that properties of the polymer such as chemical resistance decline, and the molecular weight of greater than 20,000 g/mol has a problem in that a photoresist using the polymer resin compound of the present disclosure has decreased pattern resolution.

The weight average molecular weight is measured using a gel permeation chromatography (GPC) method. Specifically, WATERS STYRAGEL HR3/HR4 (THF) is used as a column, and as a solvent, tetrahydrofuran (THF) (use after filtering with 0.45 m filter) is used, and the measurement is made under the condition of a flow rate of 1.0 mL/min and a sample concentration of 1 mg/mL. 100 μL of the sample is injected, and the column temperature is set at 40° C. As a detector, a Waters RI detector is used, and a standard is set using polystyrene (PS). Data processing is conducted using an Empower3 program.

In one embodiment of the present specification, a photosensitive resin composition includes the polymer resin compound described above, a functional monomer, a photoinitiator, a colorant and a solvent.

In one embodiment of the present specification, the functional monomer is a monofunctional monomer or a multifunctional monomer.

In one embodiment of the present specification, the monofunctional monomer may be one or more types selected from among polyethylene glycol mono(meth)acrylate, polypropylene glycol mono(meth)acrylate and phenoxyethyl (meth) acrylate.

In one embodiment of the present specification, the multifunctional monomer may be one or more types selected from among polyethylene glycol (meth)acrylate, polypropylene glycol (meth)acrylate, trimethylolethane triacrylate, trimethylolpropane triacrylate, neopentyl glycol (meth)acrylate, pentaerythritol tetraacrylate, pentaerythritol triacrylate, dipentaerythritol pentaacrylate and dipentaerythritol hexaacrylate.

In one embodiment of the present specification, the photoinitiator is not particularly limited as long as it is an initiator triggering crosslinkage through generating radicals by light, however, examples thereof may include one or more types selected from among acetophenone-based compounds, biimidazole-based compounds, triazine-based compounds and oxime-based compounds.

The acetophenone-based compound may be one or more types selected from among 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexyl phenyl ketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one and 2-methyl-1-[4-(methylthio)phenyl]-2-morpholinopropan-1-one, but is not limited thereto.

The biimidazole-based compound may be one or more types selected from among 2,2'-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole and 2,2'-bis(o-chlorophenyl)-4,4',5,5'-tetraphenyl-1,2'-biimidazole, but is not limited thereto.

The triazine-based compound may be one or more types selected from among 3-{4-[2,4-bis(trichloromethyl)-s-triazin-6-yl]phenylthio}propionic acid, 1,1,1,3,3,3-hexafluoroisopropyl-3-{4-[2,4-bis(trichloromethyl)-s-triazin-6-yl] phenylthio}propionate, ethyl-2-{4-[2,4-bis (trichloromethyl)-s-triazin-6-yl]phenylthio}acetate, 2-epoxyethyl-2-{4-[2,4-bis(trichloromethyl)-s-triazin-6-yl] phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-triazin-6-yl] phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis (trichloromethyl)-6-(1-p-dimethylaminophenyl)-1,3-butadienyl-s-triazine and 2-trichloromethyl-4-amino-6-p-methoxystyryl-s-triazine, but is not limited thereto.

The oxime-based compound may be one or more types selected from among 1,2-octadione-1-(4-phenylthio)phenyl-2-(o-benzoyloxime) (Ciba Specialty Chemicals, CGI-124), ethanone-1-(9-ethyl)-6-(2-methylbenzoyl-3-yl)-1-(O-acetyloxime) (CGI-242) and N-1919 (Adeka Corporation), but is not limited thereto.

In one embodiment of the present specification, the colorant includes a black organic pigment. In the present specification, the black organic pigment means a pigment formed with organic materials and, as a single species, displaying black series colors by absorbing light in a visible light wavelength range. For example, lactam-based pigments or perylene-based pigments may be used as the black organic pigment.

In one embodiment of the present specification, when considering solubility, pigment dispersibility, coatability and the like, the solvent of the photosensitive resin composition may be one or more types selected from among propylene glycol monomethyl ether, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, 2-hydroxyethyl propionate, 3-methyl-3-methoxybutyl propionate, ethyl-3-methoxypropionate, methyl ethoxypropionate, ethyl-3-ethoxypropionate, butyl acetate, amyl formate, isoamyl acetate, isobutyl acetate, butyl propionate, isopropyl butyrate, ethyl butyrate, butyl butyrate, ethyl pyruvate and γ-butyrol acetate, but is not limited thereto.

In one embodiment of the present specification, the photosensitive resin composition may further include additives as long as it does not adversely affect purposes of the present disclosure. For example, additives such as a dispersant, an adhesion accelerator, a curing accelerator, an antioxidant, a photocrosslinking sensitizer, an ultraviolet absorber, a thermal polymerization inhibitor and a leveling agent may be further included, however, the additive is not limited thereto.

In one embodiment of the present specification, a content of the polymer resin compound is from 5 wt % to 80 wt % based on 100 wt % of the photosensitive resin composition. When the content of the polymer resin compound is in the above-mentioned range, proper developability may be obtained.

In one embodiment of the present specification, a content of the functional monomer is from 1 wt % to 50 wt % based on 100 wt % of the photosensitive resin composition. However, the content is not limited thereto, and may be adjusted depending on the applications of the photosensitive resin composition.

In one embodiment of the present specification, a content of the photoinitiator is from 0.1 wt % to 10 wt % based on 100 wt % of the photosensitive resin composition. However, the content is not limited thereto, and may be adjusted depending on the applications of the photosensitive resin composition.

In one embodiment of the present specification, a content of the colorant is from 0.1 wt % to 15 wt % based on 100 wt % of the photosensitive resin composition. However, the content is not limited thereto, and may be adjusted depending on the applications of the photosensitive resin composition.

In one embodiment of the present specification, a content of the additive is from 0.1 wt % to 10 wt % based on 100 wt % of the photosensitive resin composition. However, the content is not limited thereto, and may be adjusted depending on the applications of the photosensitive resin composition.

In one embodiment of the present specification, the rest other than the polymer resin compound, the functional monomer, the photoinitiator, the colorant and the additive in the photosensitive resin composition may all be the solvent.

In one embodiment of the present specification, a photosensitive material is formed using the photosensitive resin composition described above.

In one embodiment of the present specification, the photosensitive material may be used as a pigment dispersion-type photosensitive material for manufacturing a TFT LCD color filter, a photosensitive material for forming a black matrix of a TFT LCD or an organic light emitting device, a photosensitive material for forming an overcoat layer, a column spacer photosensitive material, a photocurable paint, a photocurable ink, a photocurable adhesive, a photosensitive material for a printing plate or a printed circuit board, and other transparent photosensitive materials, and in manufacturing a PDP, and the like, however, the application is not particularly limited thereto. In addition, positive-type and negative-type developing processes may all be used.

The present disclosure increases utility in various materials and various processes through increasing solubility of the photosensitive resin composition by adding the polymer resin compound described above to the photosensitive resin composition.

Hereinafter, preferred examples are provided in order to illuminate the present disclosure. However, the following examples are for illustrative purposes only, and the scope of the present disclosure is not limited thereto.

Preparation Example. Synthesis of Polymer Resin Compound

Synthesis Example 1

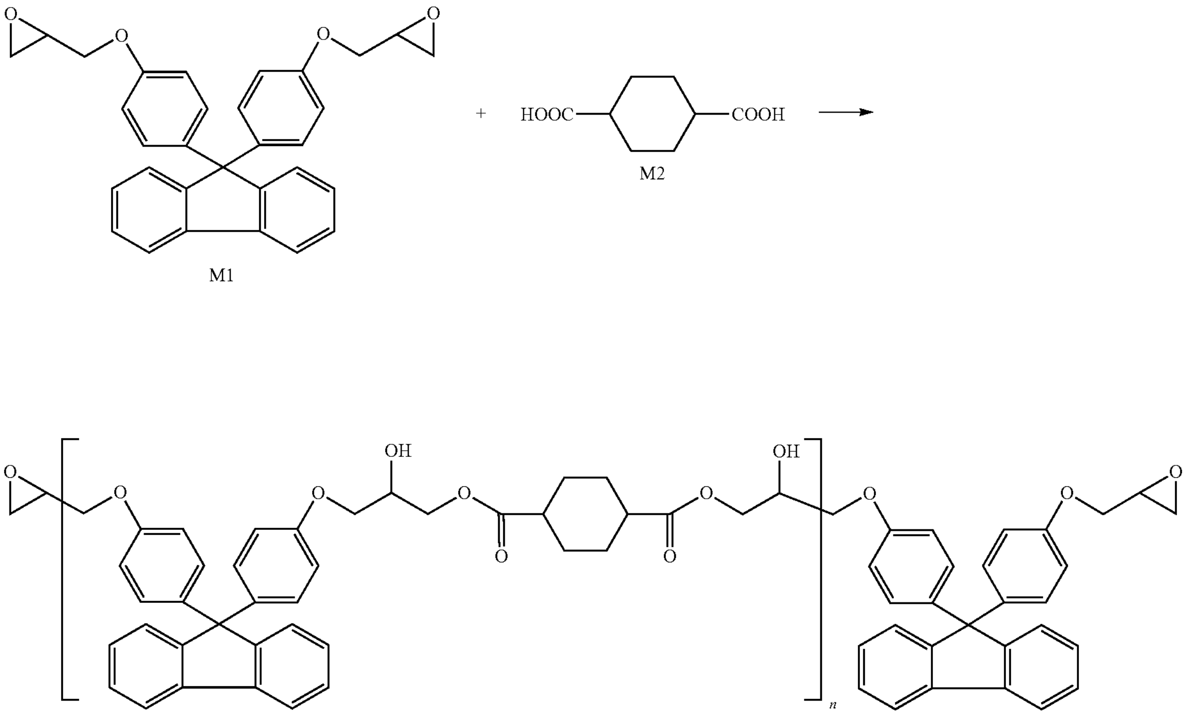

M1

M2

P1

Compound M1 (85 g) and Compound M2 (15 g) (molar ratio of M1:M2=2:1) were mixed with triphenylphosphine (1 g) that is a base catalyst, and propylene glycol methyl ether acetate (200 g) that is a solvent, for 30 minutes under the nitrogen atmosphere. Next, the reactor temperature was raised to 120° C. under the nitrogen atmosphere, and the result was stirred for 16 hours to synthesize Polymer P1.

A 1H-NMR graph of Polymer P1 is shown in FIG. 1, and Polymer P1 had a weight average molecular weight of 3,000 g/mol.

Through FIG. 1, it was identified that an epoxy peak at the end was observed near 2.65 ppm and 2.80 ppm.

Synthesis Example 2

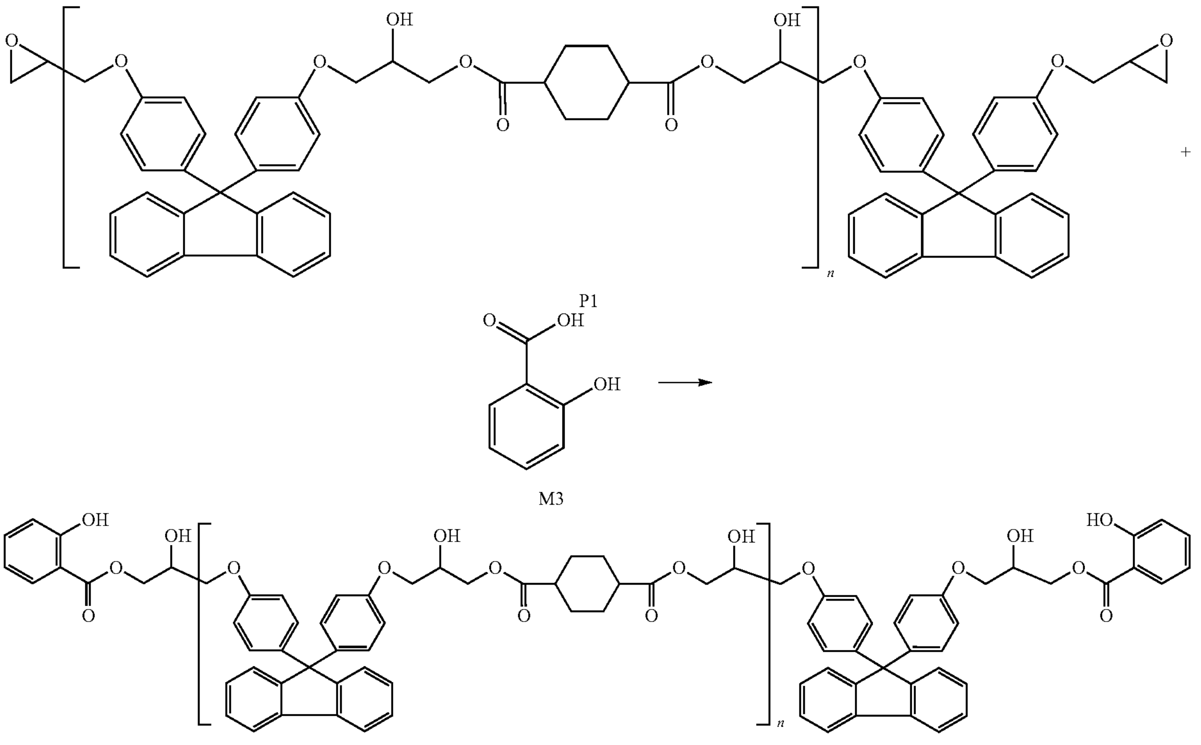

P1

M3

P2

To Polymer P1 synthesized in Synthesis Example 1, M3 (5 g) and triphenylphosphine (0.1 g) as a catalyst were introduced together with propylene glycol methyl ether acetate (10 g), a solvent, and after raising the reactor temperature to 120° C., the result was stirred for 16 hours to synthesize Polymer P2.

Polymer P2 had a weight average molecular weight of 3,300 g/mol.

Synthesis Example 3

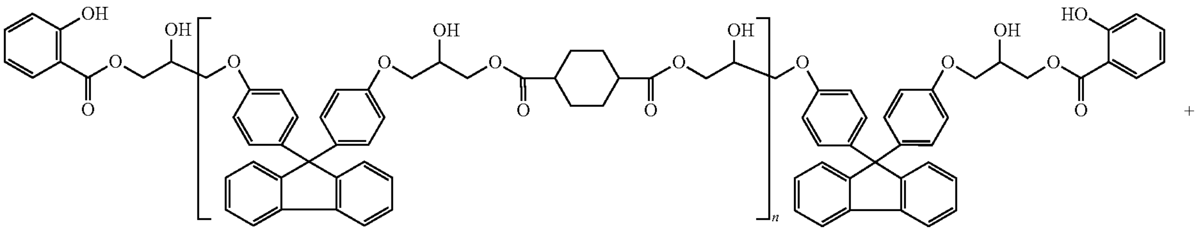

P2

-continued
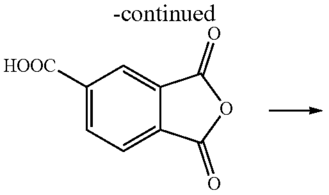
M4
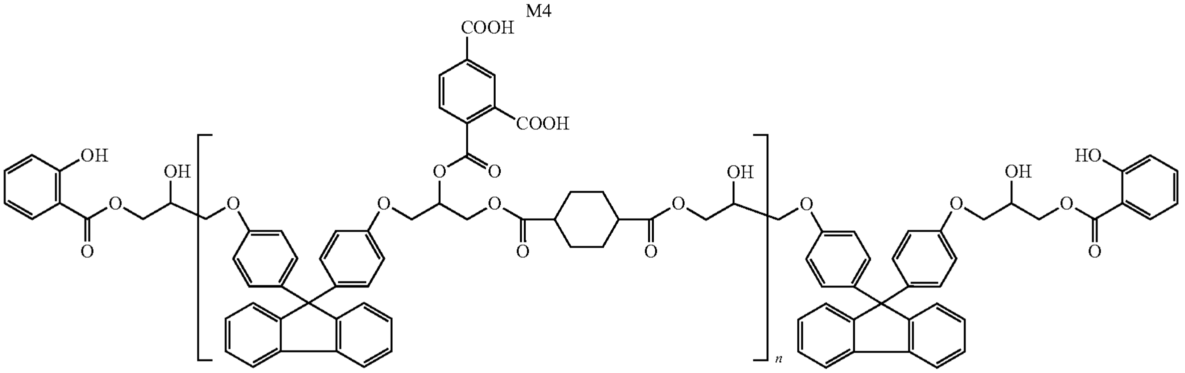
P3
To Polymer P2 synthesized in Synthesis Example 2, M4 (5 g) was introduced, and after raising the reactor temperature to 120° C., the result was stirred for 16 hours to synthesize Polymer P3.
Polymer P3 had a weight average molecular weight of 4,100 g/mol.
Synthesis Example 4
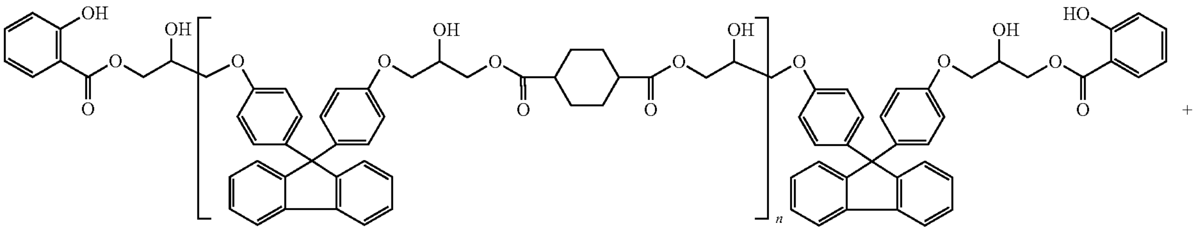
P2
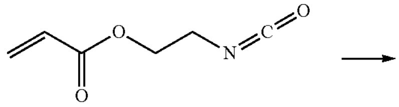
M5
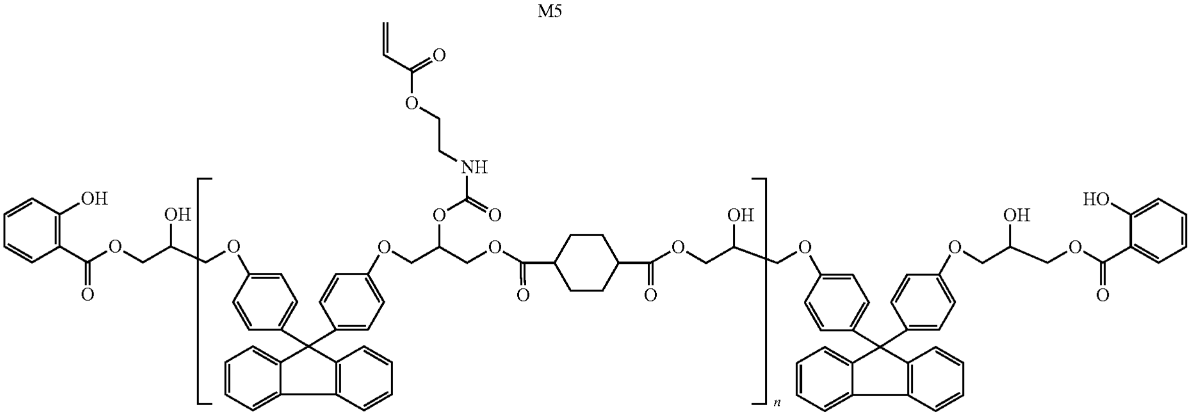
P4

Polymer P4 was synthesized in the same manner as in Synthesis Example 3 except that M5 was introduced instead of M4.

Polymer P4 had a weight average molecular weight of 6,100 g/mol.

Synthesis Example 5

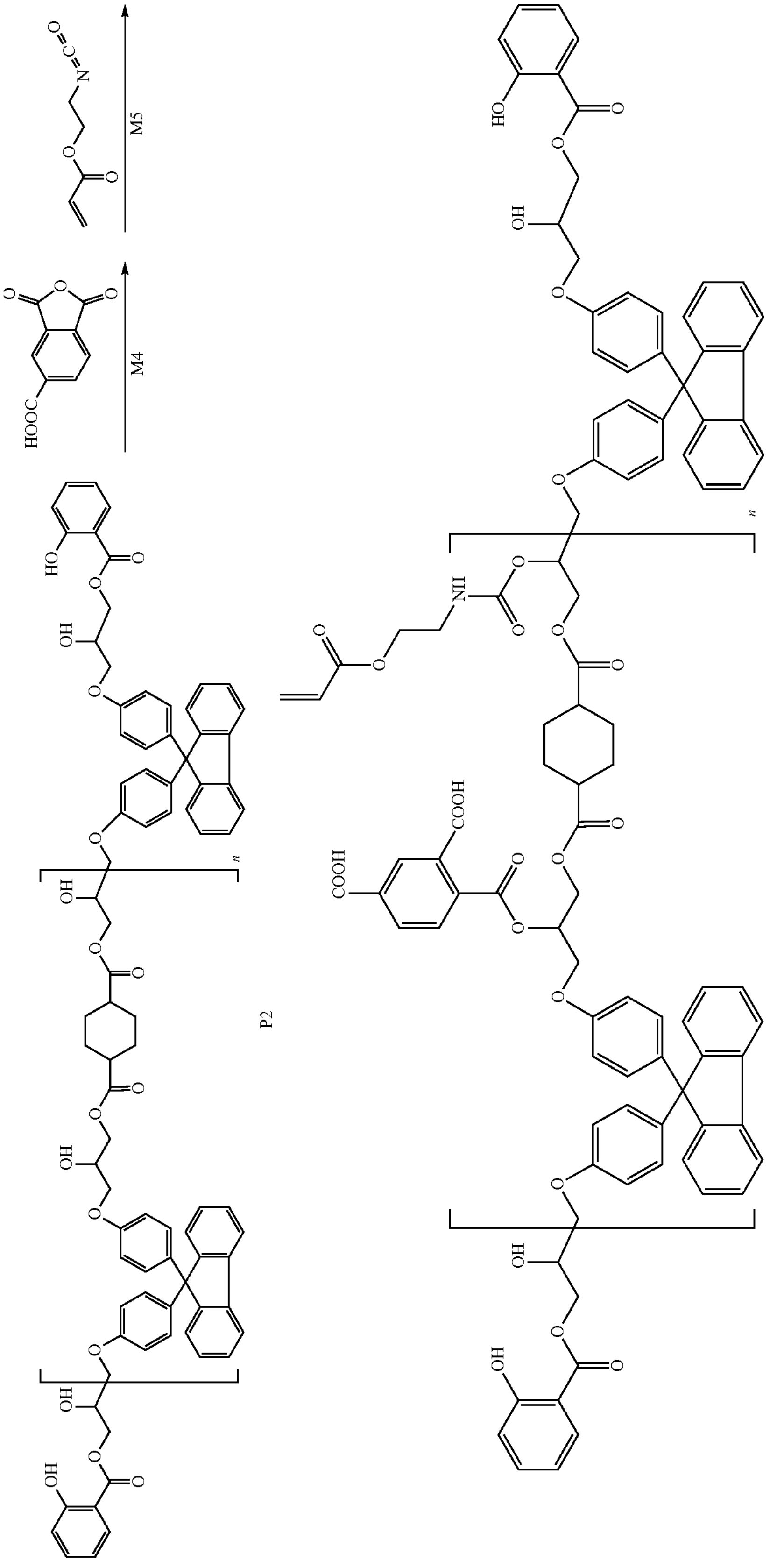
P2
P5

Polymer P5 was synthesized in the same manner as in Synthesis Example 3 except that M4 and M5 (total content of M4+M5=4 g) were all introduced instead of M4.

Polymer P5 had a weight average molecular weight of 8,000 g/mol.

Comparative Synthesis Example 1

P0

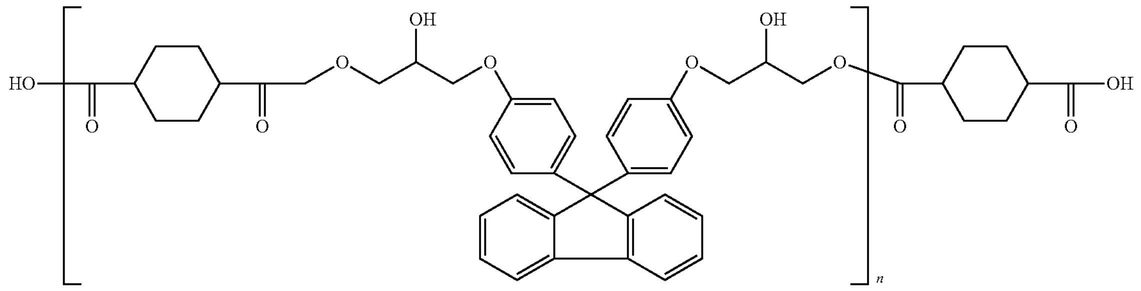

Polymer P0 was synthesized in the same manner as in Synthesis Example 1 except that the molar ratio of Compound M1 and Compound M2 was changed to 0.6:1.

A 1H-NMR graph of Polymer P0 is shown in FIG. 2, and Polymer P0 had a weight average molecular weight of 3,000 g/mol.

It was identified that the epoxy peak observed in FIG. 1 was not observed in FIG. 2, and a broad and thin carboxylic acid peak was observed near 10.5 ppm.

Specifically, when examining FIG. 3 enlarging the peak near 10.5 ppm in the graphs of FIG. 1 and FIG. 2, a finely rising peak is able to be observed in Polymer P0.

Experimental Example 1. Evaluation of Solubility

For Polymers P1 to P5 and P0 prepared in the synthesis examples and the comparative synthesis example, solubility for each of 5 solvent types that are propylene glycol methyl ether acetate (PGMEA), acetone, propylene glycol methyl ether (PGME), gamma butyrolactone (GBL) and ethyl lactate (EL) was evaluated.

Specifically, after introducing each of the polymers (0.5 g) to the solvent (10 g) at room temperature, the result was stirred, and transparency was visually identified. This was individually conducted for each of the 5 solvent types and Polymers P1 to P5 and P0.

Evaluation of transparency was conducted using a method of standing a vial holding the sample solution in front of a black paper, and checking the presence of white particles.

With the PGME, the GBL and the EL, it was identified that Polymers P1 to P5 and P0 were all favorably dissolved transparently without white particles. With the solvents of the PGMEA and the acetone, it was identified that the samples obtained by dissolving Polymers P1 to P5 were favorably dissolved transparently, however, the samples obtained by dissolving Polymer P0 not only had white fine particles floating, but also produced white precipitates after being left unattended for approximately 1 hour.

From this, it was seen that Polymer P0 prepared in Comparative Synthesis Example 1 had unfavorable solubility for PGMEA mainly used as a solvent of a photosensitive resin composition and acetone that is a cleaning solvent.

Experimental Example 2. Preparation of Pattern

After dissolving Polymer P1 (1.5 g) prepared in the synthesis example, a mill base (6.5 g), a crosslinking agent having two or more crosslinking reacting group (1.2 g) and a photoinitiator (0.2 g) in PGMEA (8.5 g), the result was spin coated at 430 rpm on a triple film substrate made of ITO-Ag-ITO with a size of 50 mm×50 mm, and pre-baked on a hot plate for 120 seconds at 100° C. After that, the result was exposed with energy of 80 $mJ/cm^2$, developed using a 2.3 wt % TMAH developing liquid, and then post-baked for 30 minutes at 230° C. to complete a pattern.

With Polymers P2 to P5, a pattern was also formed in the same manner, however, with Polymer P0 prepared in the comparative synthesis example, a pattern was not formed since the polymer was not dissolved in PGMEA and normal coating was not possible.

Specifically, fine particles visually identifiable were non-uniformly distributed on the substrate when conducting the coating, and a proper pattern was not able to be developed since a residual film remained on the pattern even when developing the pattern.

The invention claimed is:

1. A polymer resin compound represented by the following Chemical Formula 5:

[Chemical Formula 5]

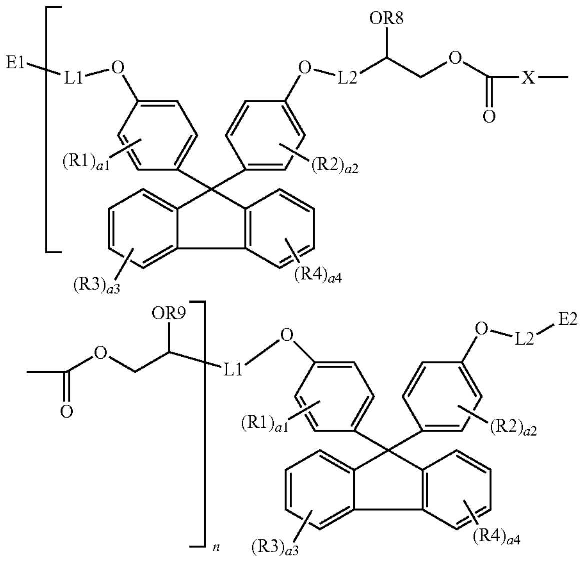

wherein, in the Chemical Formula 5,

R1 to R4 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group;

X is a substituted or unsubstituted alkylene group; a substituted or unsubstituted cycloalkylene group; or a substituted or unsubstituted arylene group;

L1 and L2 are the same as or different from each other, and each independently a direct bond; or a substituted or unsubstituted alkylene group;

a1 to a4 are the same as or different from each other, and each independently an integer of 0 to 4;

E1 and E2 are the same as or different from each other, and each independently an epoxide group; or a group represented by the following Chemical Formula 6;

R8 and R9 are the same as or different from each other, and each independently hydrogen; or a group represented by the following Chemical Formula 7-1 or 7-2;

at least one of R8 and R9 is represented by Chemical Formula 7-2; and n is an integer of 1 to 40,

[Chemical Formula 6]

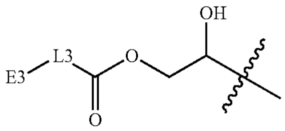

[Chemical Formula 7-1]

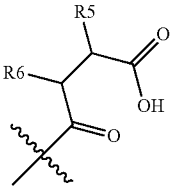

[Chemical Formula 7-2]

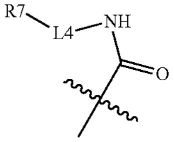

in the Chemical Formulae 6, 7-1 and 7-2,

L3 and L4 are the same as or different from each other, and each independently a direct bond; a substituted or unsubstituted alkylene group; or a substituted or unsubstituted arylene group;

E3 is hydrogen; a hydroxyl group; a thiol group; a substituted or unsubstituted alkyl group; a substituted or unsubstituted alkenyl group; a substituted or unsubstituted alkynyl group; a substituted or unsubstituted cycloalkyl group; a substituted or unsubstituted alkoxy group; a substituted or unsubstituted alkylthio group; a substituted or unsubstituted aryl group; or an epoxide group;

R5 to R7 are the same as or different from each other, and each independently hydrogen; deuterium; a halogen group; a substituted or unsubstituted acrylate group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group;

R5 and R6 optionally bind to each other to form a ring; and

means a site linked to the Chemical Formula 5, wherein, in the Chemical Formula 5, the

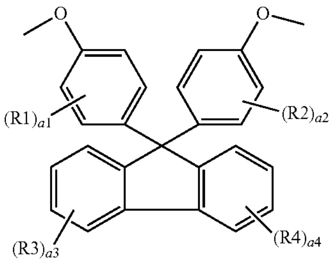

structure is present in an amount greater than 100 mol % based on 100 mol % of the

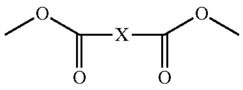

structure.

2. The polymer resin compound of claim 1, wherein the compound represented by the Chemical Formula 5 is represented by the following Chemical Formula 5-1 or 5-2:

[Chemical Formula 5-1]

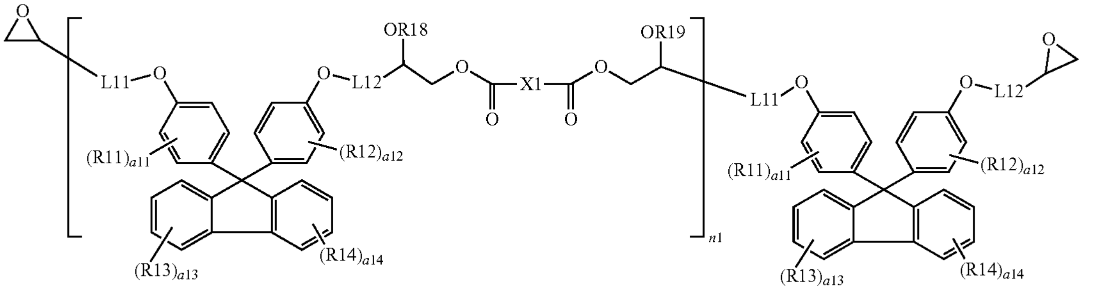

[Chemical Formula 5-2]

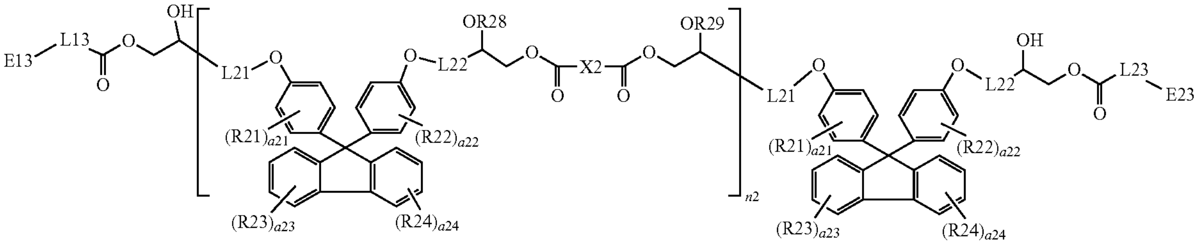

in the Chemical Formulae 5-1 and 5-2,

R18, R19, R28 and R29 are the same as or different from each other, and each independently hydrogen; or the group represented by Chemical Formula 7-1 or 7-2;

at least one of R18 and R19 is represented by Chemical Formula 7-2;

at least one of R28 and R29 is represented by Chemical Formula 7-2;

R11 to R14 and R21 to R24 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group;

X1 and X2 are the same as or different from each other, and each independently a substituted or unsubstituted alkylene group; a substituted or unsubstituted cycloalkylene group; or a substituted or unsubstituted arylene group;

L11, L12, L21 and L22 are the same as or different from each other, and each independently a direct bond; or a substituted or unsubstituted alkylene group;

a11 to a14 and a21 to a24 are the same as or different from each other, and each independently an integer of 0 to 4;

when a11 to a14 and a21 to a24 are 2 or greater, substituents in the parentheses are the same as or different from each other;

n1 and n2 are, as a repetition number, the same as or different from each other, and each independently an integer of 1 to 40;

E13 and E23 are the same as or different from each other, and each independently hydrogen; a hydroxyl group; a thiol group; a substituted or unsubstituted alkyl group; a substituted or unsubstituted alkenyl group; a substituted or unsubstituted alkynyl group; a substituted or unsubstituted cycloalkyl group; a substituted or unsubstituted alkoxy group; a substituted or unsubstituted alkylthio group; a substituted or unsubstituted aryl group; or an epoxide group; and L13 and L23 are a direct bond; a substituted or unsubstituted alkylene group; or a substituted or unsubstituted arylene group, wherein, in the Chemical Formula 5-1, the

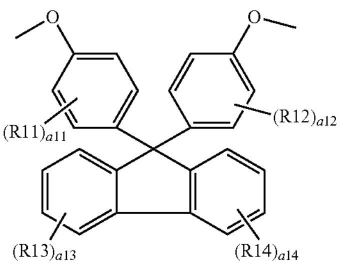

structure is present in an amount greater than 100 mol % based on 100 mol % of the

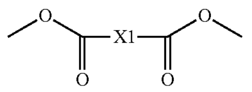

structure, and in the Chemical Formula 5-2, the

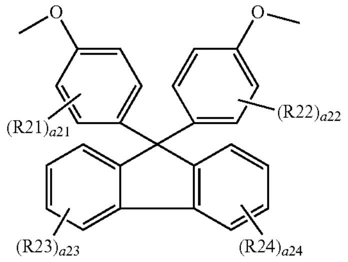

structure is present in an amount greater than 100 mol % based on 100 mol % of the

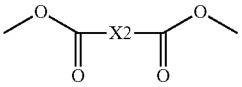

structure.

3. The polymer resin compound of claim 1, wherein a 1H-NMR analysis result of the compound has an epoxide peak between 2.6 ppm to 2.9 ppm.

4. The polymer resin compound of claim 1, wherein the compound has a weight average molecular weight of 2,000 g/mol to 20,000 g/mol.

5. A photosensitive resin composition comprising:

the polymer resin compound of claim 1;

a functional monomer;

a photoinitiator;

a colorant; and a solvent.

6. The photosensitive resin composition of claim 5, wherein a content of the polymer resin compound is from 5 wt % to 80 wt % based on 100 wt % of the photosensitive resin composition.

7. A photosensitive material formed from the photosensitive resin composition of claim 5.

* * * * *